(12) United States Patent
Miller et al.

(10) Patent No.: US 12,249,482 B2
(45) Date of Patent: Mar. 11, 2025

(54) MICROSCOPY FEEDBACK FOR IMPROVED MILLING ACCURACY

(71) Applicant: FEI Company, Hillsboro, OR (US)

(72) Inventors: Thomas Gary Miller, Portland, OR (US); Jason Arjavac, Hillsboro, OR (US); Brian Routh, Jr., Beaverton, OR (US); Mark Biedrzycki, Beaverton, OR (US)

(73) Assignee: FEI Company, Hillsboro, OR (US)

( * ) Notice: Subject to any disclaimer, the term of this patent is extended or adjusted under 35 U.S.C. 154(b) by 395 days.

(21) Appl. No.: 17/873,532

(22) Filed: Jul. 26, 2022

(65) Prior Publication Data

US 2023/0197403 A1     Jun. 22, 2023

Related U.S. Application Data

(60) Provisional application No. 63/290,438, filed on Dec. 16, 2021.

(51) Int. Cl.
*H01J 37/30* (2006.01)
*H01J 37/147* (2006.01)
(Continued)

(52) U.S. Cl.
CPC ...... *H01J 37/3005* (2013.01); *H01J 37/1478* (2013.01); *H01J 37/28* (2013.01); *H01J 37/3053* (2013.01); *H01J 2237/30405* (2013.01)

(58) Field of Classification Search
None
See application file for complete search history.

(56) References Cited

U.S. PATENT DOCUMENTS

| | | | |
|---|---|---|---|
| 7,482,586 B2 * | 1/2009 | Ishitani | G01N 23/225 250/311 |
| 8,097,846 B1 * | 1/2012 | Anguelouch | H01L 22/12 250/311 |

(Continued)

FOREIGN PATENT DOCUMENTS

| | | | | |
|---|---|---|---|---|
| EP | 2869328 A1 * | 5/2015 | | G01N 1/286 |
| JP | 2006100788 A * | 4/2006 | | G01N 1/32 |
| WO | WO-9839770 A1 * | 9/1998 | | G11B 5/1871 |

OTHER PUBLICATIONS

English machine translation for JP-2006100788-A (Year: 2006).*
Extended European Search Report dated May 9, 2023, from European Patent Application 22211532.1, 9 pages.

*Primary Examiner* — Robert H Kim
*Assistant Examiner* — Alina Kaliszewski
(74) *Attorney, Agent, or Firm* — Klarquist Sparkman, LLP

(57) ABSTRACT

Methods and apparatus are disclosed for integration of image-based metrology into a milling workflow. A first ion beam milling operation is performed to an edge at a distance from a final target position on a sample. An SEM image of the sample is used to determine a distance between the milled edge and a reference structure on the sample. Based on the determined distance, the ion beam is adjusted to perform a second milling operation to shift the milled edge to the final target position. Extensions to iterative procedures are disclosed. Various geometric configurations and corrections are disclosed. Manufacturing and analytic applications are disclosed in a variety of fields, including read-write head manufacture and TEM sample preparation. Other combinations of imaging and milling tools can be used.

26 Claims, 8 Drawing Sheets

(51) Int. Cl.
*H01J 37/28* (2006.01)
*H01J 37/305* (2006.01)

(56) References Cited

U.S. PATENT DOCUMENTS

| | | | | |
|---|---|---|---|---|
| 8,222,599 | B1* | 7/2012 | Chien | H01L 22/12 |
| | | | | 250/311 |
| 11,049,690 | B2* | 6/2021 | Zheleznyak | H01J 37/3056 |
| 11,176,656 | B2* | 11/2021 | Miller | G06F 18/2163 |
| 2007/0018099 | A1* | 1/2007 | Chitturi | G01B 15/08 |
| | | | | 250/492.21 |
| 2010/0108506 | A1* | 5/2010 | Nadeau | G11B 5/3163 |
| | | | | 204/298.36 |
| 2010/0300873 | A1* | 12/2010 | Blackwood | H01J 37/20 |
| | | | | 204/192.33 |
| 2011/0240852 | A1* | 10/2011 | Tanner | H01J 37/30 |
| | | | | 250/307 |
| 2015/0348751 | A1* | 12/2015 | Brogden | H01J 37/3023 |
| | | | | 250/307 |
| 2016/0126060 | A1* | 5/2016 | Fuller | H01J 37/22 |
| | | | | 250/492.3 |
| 2021/0407765 | A1* | 12/2021 | Routh, Jr. | H01J 37/31 |
| 2023/0115376 | A1* | 4/2023 | Klochkov | G05B 15/02 |
| | | | | 382/149 |
| 2023/0273136 | A1* | 8/2023 | Lindsay | G01N 23/2252 |
| | | | | 250/307 |

* cited by examiner

| IMAGING TOOL VIEW AXIS | | MILLING TOOL BEAM AXIS | | |
|---|---|---|---|---|
| $\Theta_I$ | $\varphi_I$ | $\Theta_M$ | $\varphi_M$ | |
| 0° | N/A | 45° - 52° | ANY | ← 281 |
| 45° - 52° | 0° | 45° - 52° | 90° | ← 282 |
| 45° - 52° | ANY | 0° | N/A | ← 283 |
| 0° | N/A | 0° | N/A | ← 284 |

400

410 CAUSE A MILLING TOOL TO MILL A SAMPLE TO A FIRST EDGE, USING A FIRST VALUE OF A CONTROL PARAMETER

420 ACQUIRE, FROM AN SEM, AN IMAGE SHOWING THE FIRST EDGE AND A REFERENCE STRUCTURE ON A SURFACE OF THE SAMPLE

430 BASED ON THE FIRST VALUE AND ON RELATIVE POSITIONS, IN THE IMAGE, OF THE FIRST EDGE AND THE REFERENCE STRUCTURE, DETERMINE A SECOND VALUE OF THE CONTROL PARAMETER

440 CAUSE THE MILLING TOOL TO MILL THE SAMPLE TO A SECOND EDGE, USING THE SECOND VALUE OF THE CONTROL PARAMETER

*FIG. 4*

MICROSCOPY FEEDBACK FOR IMPROVED MILLING ACCURACY

CROSS REFERENCE TO RELATED APPLICATIONS

This application claims the benefit of U.S. Provisional Application No. 63/290,438, filed on Dec. 16, 2021, which is incorporated herein by reference in its entirety.

FIELD

The disclosure pertains to improvement of milling accuracy.

BACKGROUND

Ion beam milling is increasingly used for machining micro- and nano-scale devices. However, ion beam mills have inherent sources of positioning error and, as device scales continue to shrink, meeting target tolerances can be challenging. Accordingly, there remains a need for improved technology for precision milling of micro- and nano-scale devices.

SUMMARY

In brief, the disclosed technologies combine imaging with milling. Through feedback, higher accuracies characteristic of an imaging tool can be achieved with a milling tool having lower inherent accuracy. In examples, a distance measured on an image is used to shift a preliminary milled edge to a target position with higher accuracy than achievable by the milling tool alone.

In a first aspect, the disclosed technologies can be implemented as an apparatus incorporating a milling tool, an imaging tool, and a controller. The milling tool is configured to mill a sample using a first particle beam. The imaging tool is configured to generate one or more images of the sample using a second particle beam. The controller is configured to cause the milling tool to mill the sample to a first edge, using a first value of a control parameter; and further to determine a second value of the control parameter changed from the first value by an amount based on a distance between the first edge and a target position. The distance is determined from an image, acquired by the imaging tool, of a surface of the sample. The controller is further configured to cause the milling tool to mill the sample to a second edge, using the second value of the control parameter.

In some examples, the first particle beam and the second particle beam can incorporate different respective species. The first particle beam can be a focused ion beam (FIB) and the imaging tool can incorporate a scanning electron microscope (SEM). The image can be a first image, the milling to the second edge can expose a cut face of the sample, and the controller can further be configured to cause the imaging tool to acquire a second image of the cut face of the sample. A common orientation of a view axis can be used by the imaging tool for capturing the first image and the second image. The controller can be configured to cause a view axis of the imaging tool to be rotated relative to the sample, between the acquiring the first image and the acquiring the second image. The view axis of the imaging tool can be within 10° of a normal to the surface for acquiring the first image, and can be in a range 40°-60° from the normal to the surface for acquiring the second image. The control parameter can determine a position, in a direction along the surface and perpendicular to the first edge, of a sweep of the milling tool.

In a second aspect, the disclosed technologies can be implemented as a method. An image of a surface of a sample is acquired from a scanning electron microscope (SEM). A distance to shift a milling position is determined based on relative positions of a milled edge and a reference structure in the image. The distance is stored. The stored distance is usable for shifting the milled edge, in a subsequent milling operation, to a predetermined spatial relationship with the reference structure.

In some examples, the distance can be a first distance and the predetermined spatial relationship can be a tolerance range of a second distance. The second distance can be the distance from (i) a datum defined by the reference structure to (ii) a line containing the shifted milled edge. In other examples, the distance can be a first distance, and determining the first distance can further include determining a second distance from a central coordinate of the reference structure to a line containing the milled edge. A linear scaling can be applied to the second distance to obtain the first distance.

In certain examples, the image can be a first image and the method can include acquiring, from the SEM, a second image of a cut face exposed by the subsequent milling operation. The reference structure can include two distinct markings. A centroid of the reference structure can identify a position of a target device, in the sample, to be exposed by the subsequent milling operation. The predetermined spatial relationship can be a tolerance zone about the centroid of the reference structure.

In further examples, the acquiring and determining operations can be repeated after respective milling operations, including the subsequent milling operation, until a termination condition is met. The repeated operations can provide convergence to a given target position on the sample. Alternatively or additionally, the repeated operations can successively target a sequence of target positions on the sample.

The method can include correcting the distance for edge effect at the first edge. The subsequent milling operation can be performed using the same milling tool as used to create the milled edge initially. The subsequent milling operation can be performed using a focused ion beam (FIB). The method can be used to produce, from the sample, a read-write transducer or a lamella for transmission electron microscopy.

In another aspect, the disclosed technologies can be implemented as computer-readable media storing program instructions executable by one or more hardware processors. Upon execution of the instructions, the processor(s) are actuated to: (a) cause a milling tool to mill a sample to a first edge, using a first value of a control parameter; (b) acquire, from a scanning electron microscope (SEM), an image depicting the first edge and a reference structure on a surface of the sample; (c) based on the first value and on relative positions, in the image, of the first edge and the reference structure, determine a second value of the control parameter; and (d) cause the milling tool to mill the sample to a second edge, using the second value of the control parameter.

In some examples, the determining the second value of the control parameter can include applying a correction for an angle between a view axis of the SEM and a normal to the surface of the sample. The surface can be a major surface of the sample, the first edge can be a boundary between the major surface and a cut face exposed by the milling to the first edge, and a dihedral angle between the cut face and the major surface can be in a range 60°-120°.

In additional examples, milling the sample to the first and second edges can expose first and second cut faces of the sample respectively, and the instructions can further actuate the processors to cause a compensatory tilt, between the milling tool and a stage on which the sample is mounted, to be applied before the milling to the first edge. The compensatory tilt can control a dihedral angle, between (i) the second cut face and (ii) a remaining portion of the surface of the sample, to be within a predetermined range. The sample can be a first sample, the image can be a first image, the SEM can be a first SEM. The instructions can further actuate the processors to (e) cause the milling tool to mill a second sample to a third edge, exposing a third cut face of the second sample; (f) cause the milling tool to mill the second sample to a fourth edge, thereby exposing a fourth cut face of the second sample. The third and fourth edges can make an angle between 60°-120° inclusive on a major surface of the second sample. The third and fourth cut faces can intersect in a fifth edge. The instructions can further actuate the processors to (g) acquire, from a second SEM, a second image of the fourth cut face; and (h) determine the compensatory tilt angle from relative positions of the fourth and fifth edges in the second image.

The foregoing and other objects, features, and advantages of the invention will become more apparent from the following detailed description, which proceeds with reference to the accompanying figures.

BRIEF DESCRIPTION OF THE DRAWINGS

FIG. 4 is a flowchart of a second example method for milling with image-based feedback, according to the disclosed technologies.

DETAILED DESCRIPTION

Introduction and Overview

Figure 1:
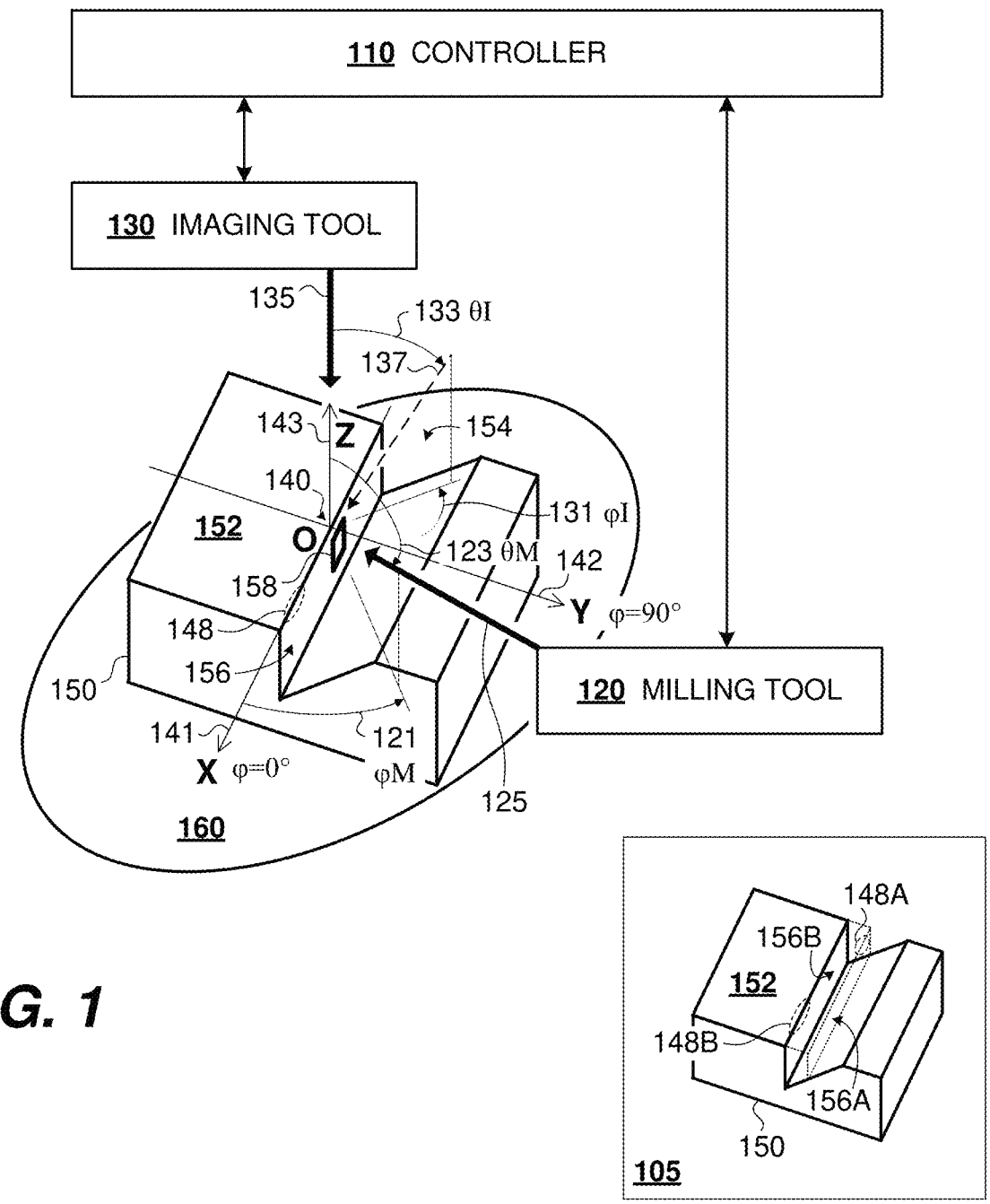
FIG. 1 is a diagram of an example apparatus with which the disclosed technologies can be implemented.

As technology has evolved and micromachining applications have increased, focused ion beam (FIB) milling has become a technology of choice. FIB milling can provide etching of arbitrary shapes across a wide range of materials with good quality finished surfaces. FIB milling can be performed under program control, without masks or custom tooling. FIB milling is versatile: a single FIB tool can be used for machining, imaging, and ion implantation, allowing FIB milling to integrate effectively with a variety of process workflows. FIB milling has proven to be well-suited for micromachining tasks requiring accuracy on the order of 10s of nanometers. (Although accuracies below 10 nm can be achieved under low beam current conditions, such conditions may be impractical for some micromachining applications.) As an imager, some present day FIB milling tools can offer about 20 nm resolution. A number of factors limit the accuracy of FIB milling tools, including temporal and spatial variations of a beam source, beam optics, and instability of the ion beam itself.

Some micromachining applications demand greater accuracy than what is achievable with current FIB milling tools. Two non-limiting examples include manufacture of readwrite heads for magnetic storage devices, and TEM sample preparation of 20 nm or below.

Examples of the disclosed technologies guide a milling tool having lower inherent resolution (e.g. ~10 nm to ~50 nm for an FIB tool) using an imaging tool having higher resolution. For example, a scanning electron microscope (SEM), can have about 2 nm resolution. As for FIB tools, the SEM imaging resolution value can be dependent on precise operating conditions, being about 2 nm for some applications of interest herein, or as low as 0.6 nm in other configurations. Particularly, measurements on a high resolution SEM image can be used as feedback to an FIB milling process, to achieve milling accuracy unachievable by the milling tool alone.

In trials, an unaided FIB milling tool was found to have cut placement reproducibility of about +9 nm (three standard deviations). By reducing or removing some significant sources of variability, the disclosed technologies were able to achieve cut placement reproducibility of about +5 nm (three standard deviations).

Although some examples are described using an FIB tool and SEM in combination, the disclosed technologies are not limited to these particular tools. Rather, the disclosed technologies can be applied using any high resolution imaging tool to improve performance of any lower resolution machining or micro-machining tool.

Through the use of disclosed technologies, the quality and reproducibility of manufactured devices, prepared samples, or analysis on cut faces can be improved in a wide range of applications.

Terminology

The usage and meaning of all quoted terms in this section applies throughout this disclosure unless clearly indicated otherwise or repugnant to the context. The terminology below extends to related word forms.

"Analysis" refers to operations used for characterizing a sample. Analysis can include various forms of imaging, probe measurements of electrical properties, or non-contact measurements of particle or radiation scattering. Analysis operations can include delayering, electron backscatter analysis, electron microscopy, etching, imaging, mass spectrometry, material analysis, metrology, nanoprobing, spectroscopy, or surface preparation. During or after a milling procedure, analysis can be performed at one or more layers exposed by the milling. Some analysis can require preparation of the exposed surface, e.g. by polishing, prior to performing the analysis. Some analysis can require that milling action be paused for analysis to be performed, while other analytic techniques can be conducted on-the-fly during milling. Equipment or instrumentation for performing such operations is referred to as an "analytic instrument", or simply "analyzer". Some analytic instruments of interest herein incorporate a scanning electron microscope (SEM).

An "azimuthal angle" is a signed angle defined or measured around an axis, from a reference plane containing the axis. The axis can be an axis of rotation, and the azimuthal angle can be varied by performing a rotation about the axis. In some disclosed examples, the axis can be parallel to an axis of rotation of a sample stage, and can be normal to a surface of a sample mounted thereon. Thus, an azimuthal angle of an incident particle beam can be varied by rotating the stage about its sample axis. The reference plane can be normal to a working surface of the sample and can contain the rotation axis of a stage on which the sample is mounted. An azimuthal coordinate is analogous to longitude of a terrestrial location.

A "beam" is a directional flow of particles or energy. Common beams of interest in this disclosure are particle beams, such as electron beams or ion beams. A beam can have finite extent transverse to its principal longitudinal direction of flow. A line joining the centroids of two or more transverse cross-sections of a beam is an "axis" of the beam.

A "controller" is an electronic device coupled to one or more actuators to effect a change in a physical parameter, or coupled to one or more sensors to monitor a physical parameter. Some controllers can include a microprocessor which can be programmed to execute machine readable instructions. The descriptions herein of computing devices are generally applicable to such controllers. Such controllers can include additional electronic circuitry such as filters and amplifiers. Other controllers can include analog circuitry such as filters and amplifiers without any microprocessors.

A "coordinate" is a number, optionally with a unit, that indicates a position or orientation of a point or object in space. Common coordinates can be linear (e.g., longitudinal coordinate in the direction of a beam axis) or angular (e.g., an angle in spherical coordinates). In some described examples, a coordinate indicating a position of a milled edge can be measured along a Y axis perpendicular to the milled edge.

A "datum" is a reference line or reference point defined for a sample, associated equipment, or an associated coordinate system, from which measurements to other features or objects can be made. In some examples herein, a datum can be a centroid or centerline (e.g. 831 in FIG. 8) of a reference structure (e.g. 806).

A "dihedral angle" between two planar surfaces intersecting at an edge is a positive angle in a range (0°, 180°) measured in a plane orthogonal to the edge.

"Distance" is a measure of length between two features on a sample or in an image of the sample. Both features can be present at a given time (e.g. a milled edge and a reference structure), or one of the features can be a target position (e.g. a distance from an existing milled edge to a location of a desired milled edge). A distance between two points can be a Cartesian distance between the points. A distance between a point and a line can be a length of a perpendicular from the point to the line. A distance to a feature having a finite extent can be measured relative to a central location (e.g. a centroid) of the feature. A measured distance can be corrected for imaging geometry (e.g. tilt of a view axis relative to an imaged surface) or can be corrected for imaging artifacts (e.g. flare).

An "edge" is a line along an intersection of two surfaces, across which the surface normal is discontinuous. In some disclosed examples, an edge can be formed between a major surface of a sample and a cut face exposed by milling. Successive milling operations can move such an edge.

An "edge effect" is an artifact in an image arising from an edge on the imaged sample. In an SEM image, the edge can appear brighter (sometimes termed "flare") than the adjacent intersecting surfaces.

An "electron beam" is a directional flow of electrons.

An "electron microscope" is a type of analytic equipment in which a sample is illuminated by an electron beam, and resulting particles or electromagnetic radiation are used to form a spatially resolved image. A scanning electron microscope (SEM) images a sample surface based on reflected, secondary, or backscattered particles or radiation from one or more surfaces of the sample. Because beam interactions detected by a SEM occur at or near this surface, a SEM can operate on samples of arbitrary thickness. In contrast, a transmission electron microscope (TEM) images a sample volume based on transmitted electrons (including scattered electrons). A TEM operates on samples of about 10-150 nm thickness, which can be mounted on a grid for mechanical support and thermal conductivity; in turn the grid can be held in a sample holder. A TEM can provide magnifications up to and exceeding 50 million, while SEM magnifications are usually limited to about 2 million. In this disclosure, scanning transmission electron microscopes (STEM), which perform imaging of transmitted electrons, are considered to be both SEMs and TEMs. The electron beam in an electron microscope can be generated in an electron gun, and accelerated, focused, or steered through a series of stages toward a sample chamber.

The term "expose" refers to an action of bringing feature interior to a sample to a surface of the sample, e.g., by removing material between the previously buried feature and a previous surface of the sample.

A "focused ion beam" ("FIB") is a beam of ions whose focus can be controlled to direct the beam to a spot on a surface, or which can be swept over a sample in a sweep pattern. An FIB tool can be used for analysis, deposition, or removal of material at the incident spot. Some FIB tools are used for milling. Commonly, an FIB tool comprises positive elemental ions, such as Xe+ or Ga+, however these are not requirements. Ion beam species such as Ga+ can be sourced from e.g., a liquid metal ion source (LMIS), while other ion beam species such as Xe+ can be produced in a plasma. An FIB produced with a plasma source can be termed a plasma focused ion beam (PFIB).

The term "imaging" refers to a process for obtaining a two-dimensional representation (dubbed an "image") of a parameter value over a region of interest of a sample. In some examples, the imaged parameter can be reflectivity of an incident particle beam (e.g. by SEM), but this is not a requirement, and visible light or other parameters can also be imaged. In disclosed examples, the image can indicate features such as edges or reference structures on the sample. In further examples, the region of interest can include at least portions of one or more surfaces of the sample.

An "imaging tool" is an apparatus capable of imaging. In disclosed examples, an SEM can be used as an imaging tool. However, this is not a requirement, and other high-resolution imaging tools such as atomic force microscopes or super-resolution optical microscopes (e.g., using temporal variation or fluorescence techniques) can also be used. An FIB tool can perform imaging, however better spatial resolution can be achieved by SEM or other techniques. A "view axis" is a straight line along which an imaging tool views an imaged region of interest. Particularly, for an imaging tool that directs a beam onto the imaged region of interest, the view axis can be the beam axis that passes through a central point (e.g. a centroid) of the imaged region of interest.

The term "iteration" refers to each of multiple times a given operation or sequence of operations is performed. A sequence of iterations is dubbed a "loop". A loop capable of iterating multiple times can sometimes execute just one iteration. An iteration of a loop need not execute all operations in the loop, but can terminate or exit early if a termination condition is met.

A "lamella" is a thin sample imaged in a transmission electron microscope (TEM). A lamella can have thickness in a range of 10-50 nm, or 20-30 nm.

The term "linear scaling" refers to an operation $y = A \cdot x + B$ performed on an input x to obtain an output y, where A and B are constants.

"Milling" is a material removal process over a path that is guided by movement (sometimes termed "sweep") of a milling tool relative to a sample being milled. A milling operation can expose one or more "cut faces" of a sample by removing material up to and on one side of the cut face. Generally, a cut face intersects a major surface of the sample: the bottom of a trench having rectangular or trapezoidal cross-section is not termed a cut face. In examples, milling can be performed using a focused ion beam (FIB). Milling is a form of "etching", which refers more generally to any subtractive process for removing material from a sample. Diffuse chemical etching may not be considered as milling. However, ion beam assisted chemical etching can be site specific at the location of the ion beam, and can be regarded as milling. A "milling tool" is an apparatus capable of milling.

A "parameter" is a quantity that can have a particular "value". While parameters often have numerical values, this is not a requirement, and some parameter values can be logical values, strings, or data structures. Some parameters can be control parameters, e.g. set by a controller to affect a physical device or physical operation. Other parameters can be sensed parameters, e.g. determined by a physical environment and evaluated (e.g. from an image) by a controller or measuring apparatus. Some control parameters of interest herein include parameters defining one or more coordinates for a milling operation on a sample, which can include beam steering controls, stage positioning controls, and the like.

A "particle beam" is a beam comprising a directional flow of particles. A "particle" is a distinct unsubdivided unit of a flow of matter. Particles of common interest in this disclosure include charged particles such as electrons or ions (such as Ga, Xe, or protons), however particles are not limited thereto. Electrons in an electron beam are considered a different species than ions in an ion beam despite some ions containing bound electrons. In some examples, particles of interest are restricted to species having mass, such as electrons or ions. In other examples, particles of interest can include massless photons. To illustrate, pulsed laser beams (e.g. a "femtosecond laser" having pulse duration less than 1 ps) can be used for milling in applications of the disclosed technologies.

A "polar angle" is an unsigned angle defined or measured going away from an axis. The axis can be an apparatus axis, a beam axis, or a normal to a sample surface. The polar angle is analogous to the complement of the latitude of a terrestrial location—i.e. polar angle is equal to 0° at the North Pole (where latitude is 90°N), and equal to 90° at the equator (where latitude is) 0°. Some polar angles of interest herein are approximately 0° or about 45°-52°. Some polar angles of interest herein are between a normal to a sample surface (this normal can be parallel to a rotation axis of a stage supporting the sample) and an axis of a particle beam incident on the sample.

A "read-write transducer" (or "read-write head") is a device capable of reading or writing magnetically encoded data on a magnetic storage medium. Data can be written using a magnetic field generated when electrical current is driven through the transducer. Data can be read using voltage induced in the transducer by a magnetic field provided by magnetized domains in the magnetic storage medium. Some examples of the disclosed technology can be used to accurately mill a cut face of a read-write transducer, for metrology or for manufacture.

A "reference structure" (sometimes termed "fiducial") is a structure manufactured into a sample for use in determining a location of another structure or device in the sample. Some reference structures can include a plurality of distinct elements (dubbed "markings"), for example on opposite sides of a target device. A reference structure can be visible in an image of the structure and can be used as a reference for measuring coordinates, distances, or angles of other features in the image. A reference structure can be a two-dimensional feature on the sample surface, or can have three-dimensional extent into the depth of the sample, so that the reference structure remains visible as successive layers of the surface are etched away.

A "region of interest" (ROI) is a portion of a sample surface over which an electron beam is scanned and/or is a region of the sample that includes a feature or structure, e.g., a target, that is the subject of subsequent analysis. The term ROI does not refer to any human interest.

A "rotation" is a change in angular orientation of an object relative to another object or relative to a fixed coordinate system. In some examples, a tool axis (e.g. a view axis or beam axis of a process tool) can be rotated relative to a sample. Rotation can be performed by rotating all or part of the process tool, by steering a beam, by rotating the sample, or by any combination of the above. A rotation that changes a polar angle is dubbed a "tilt" with respect to that polar angle.

A "sample" is a physical object upon which imaging, milling, or other analytic or manufacturing procedures are performed. Common samples can incorporate multi-layer electrical or electronic structures, or other material structures, undergoing manufacture or being prepared for imaging or another analytic procedure. A "major surface" of a sample is a surface of the sample whose area is not substantially exceeded by any other surface of the sample. For convenience of description, samples are considered to have top and bottom major surfaces, with the bottom surface supported on a stage and the top surface exposed to one or more tools or beams.

A "spatial relationship" can be any relationship between positions or orientations of two or more objects. One or more of the spatially related objects can be a sample, a feature of the sample, a process tool or a beam or component thereof, a stage on which the sample is mounted, an axis or normal to any such physical object, or an imaginary geometric entity defined by one or more such physical objects (e.g. a centroid of a sample feature, or a line joining two features). In some instances, a spatial relationship can be specified with a "tolerance" indicating an allowable spread in a quantity defining the spatial relationship. A tolerance can be one-dimensional (dubbed "tolerance range"), such as a distance or angle within a predetermined range, or multi-dimensional (dubbed "tolerance zone"). Non-limiting examples of tolerance zones include: a feature being within a two-dimensional area or a three-dimensional volume relative to one or more other features; or a view axis or beam axis being in a two-dimensional angular cone with regard to another direction.

A "stage" is an apparatus to which a sample can be attached and having actuators for adjusting a position or orientation of the sample. A "multi-axis stage" has multiple degrees of freedom, offering spatial adjustment of a sample in varying combinations of translation or rotation.

The term "sweep" refers to a spatial traversal. Common sweeps in this disclosure are one-dimensional or two-dimensional sweeps of an FIB tool (or other milling tool) over a region of interest of a sample. A sweep can be performed in one or more passes over the region of interest.

The term "target" refers to a desired objective of an analytic, preparation, or manufacturing procedure on a sample. Non-limiting examples of targets include: a feature or device to be exposed by milling the sample; a coordinate to be reached by milling the sample; a region of interest to be imaged; an orientation to set a process tool relative to a sample. In some instances, a target may not be exactly attained, but can be successfully attained within a predetermined tolerance.

A "termination condition" is a criterion under which an iterative process ceases to perform further iterations.

The terms "top," "bottom," "up," "down," "above," "below," "horizontal," "vertical," and the like are used for convenience, with respect to a common configuration in which an exposed major surface of a horizontal sample has an outward normal directed upward, e.g. the sample is accessible to process tools from above. An axis of a process tool (e.g. view axis of a imaging tool or a beam axis of an FIB milling tool) can be approximately normal downward onto the surface, or can be tilted at an angle (sometimes in a range) 40°-60° relative to the normal. One of ordinary skill will understand from this disclosure that a choice of actual orientation can be varied without departing from the scope of the disclosed technologies.

Example Apparatus

FIG. 1 is a diagram 100 of an example apparatus together with some features of an environment in which the apparatus can be deployed. In communication with controller 110, milling tool 120 and imaging tool 130 can perform respective operations on sample 150. Sample 150 can be mounted on stage 160. In some examples, sample 150 and stage 160 can be part of the environment for apparatus components 110, 120, 130 while, in other examples, stage 160 can be included as part of the apparatus.

To facilitate description, a coordinate system is shown having Cartesian XYZ axes 141-143 and an origin 140 ("O") on a major top surface 152 of sample 150. As illustrated, Z axis 143 is an outward normal to surface 152, X axis 141 is parallel to a longitudinal extent of slot 154, and Y axis 142 forms a right triad (XYZ) with axes 141, 143. Azimuthal angles φ are defined about the Z axis, with the X and Y axes at φ=0° and φ=90° respectively (see e.g. φM 121 and FIG. 2A). Polar angles θ are defined downward from the Z axis (θ=0°), with the XY plane being at θ=90° (see also e.g. θM 123 and FIG. 2A). For purpose of description, the coordinate system can be fixed in the reference frame of sample 150, so that e.g. a polar angle of a beam or a coordinate position of a milled edge changes equivalently regardless of whether a rotation or translation is applied to a beam (125, 135) or to stage and sample (150, 160).

Milling tool 120 can be configured to mill sample 150 using a particle beam 125. In the illustration, slot 154 has been milled by tool 120 entering from above surface 152, from a direction having polar angle θM 123 and azimuthal angle φM 121, to expose a cut face 156 in which a cross-section of a structure 158 can be discerned. In some examples, beam 125 can be a focused ion beam (FIB), however this is not a requirement, and other beams can be used. Milling can be performed by scanning beam 125 across sample 150, by translating stage 160, or by any combination of these or other motions to achieve relative motion between beam 125 and sample 150.

Imaging tool 130 can be configured to generate one or more images of sample 150, using particle beam 135. In the illustration, imaging tool 130 can generate an image looking directly from above sample 150 (polar angle) θI=0°, however this is not a requirement and imaging can be performed from other angles. Particularly, in some examples, imaging tool 130 can be rotated relative to sample 150 to acquire another image from an oblique direction having polar angle θI 133, azimuthal angle φI 131 as shown by dashed arrow 137.

Controller 110 can oversee operations of milling tool 120 and imaging tool 130. Milling can be controlled using a control parameter which can take on successive values as milling proceeds. In some examples, the control parameter can control a Y coordinate of a milled surface formed by sweeping beam 125 in the X direction. Thus, the control parameter can be a coordinate measure for either milling tool 120 or stage 160. Alternatively, the control parameter can be an indirect position control, such as a voltage applied to a steering component in the path of beam 125, or a voltage applied to an actuator coupled to perform translation of stage 160. Using a first value of the control parameter, controller 110 can cause milling tool 120 to mill sample 150 to a first edge. To illustrate, the intersection of major surface 152 and cut face 156 (156A, 156B in inset 105) defines an edge 148 (148A, 148B in inset 105). As beam 125 progressively mills sample 150 (see inset 105), an extent of slot 154 can reach a first position of edge 148A (dubbed a "first edge").

Controller 110 can also determine a second value of the control parameter different from the first value, using an image of surface 152 acquired by imaging tool 130. That is, a distance between edge 148 and a target position can be determined from the image, and the control parameter can be changed by an amount based on this distance, to obtain the second value of the control parameter. Finally, using the second value of the control parameter, controller 110 can cause milling tool 120 to perform additional milling to reach a second position of edge 148B (dubbed a "second edge"), e.g., to mill away additional sample volume between the first edge and the second edge to expose a cut face containing the second edge.

As an illustration, the edge and the target position can be at Y coordinates -55 nm and +10 nm respectively and, accordingly, a distance of 65 nm can be determined. A beam steering control parameter having a Y-direction sensitivity of 10 nm/Volt can be changed by 65/10=6.5 V to effect the desired second edge. In some examples, the change to the control parameter can be applied gradually, e.g. 0.25 V on each of 26 sweeps of the additional milling operation.

Numerous variations and extensions can be implemented within the scope of disclosed technologies. In some examples, particle beams 125, 135 can be different types of beams, and can comprise particles of different species. To illustrate, milling can be performed with a focused ion beam 125, comprising Ga+, Xe+, or another ion species, while imaging can be performed with a scanning electron beam 135, comprising electrons. In examples, imaging tool 130 can be a scanning electron microscope; however, this is not a requirement.

Subsequent to milling to second edge 148B, the controller can cause imaging tool 130 to acquire an image of cut face 156B. In some examples, the acquired images of top surface 152 and cut face 148 can be acquired from a single view axis of beam 135, e.g. at an oblique angle such as 133. In other examples, controller 110 can cause a view axis of imaging tool 130 to be rotated between the two image acquisitions. To illustrate, the first image (for measuring distance) can be acquired viewing sample 150 directly from above, with view axis along beam 135 as illustrated, and the second image (e.g. for metrology of cut face 148) can be acquired with a view axis along arrow 137 as illustrated. In some examples, the view axis for the first image can have a polar angle $\theta I \le 10°$, while the view axis for the second image can have a polar angle $40° \le \theta I \le 60°$.

Figure 3:
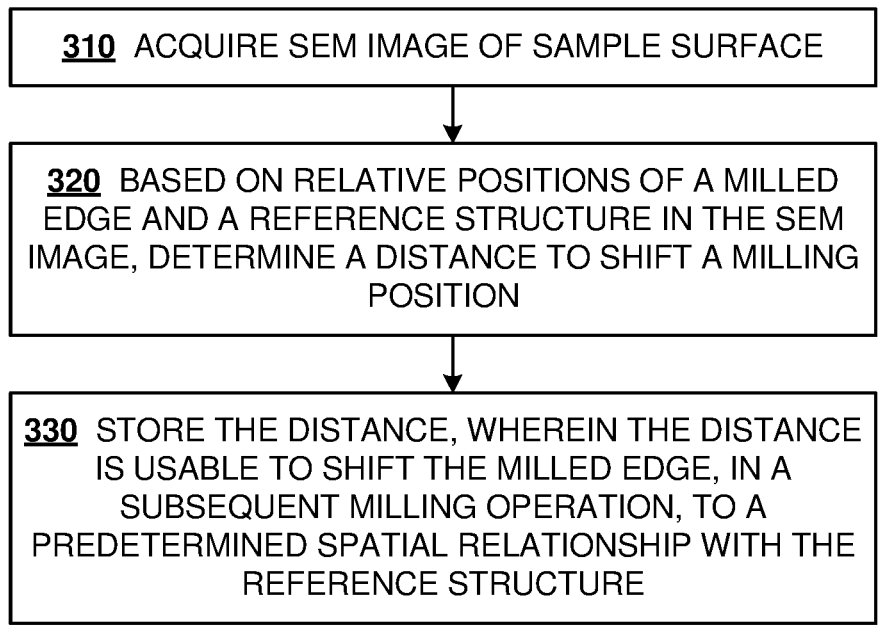
FIG. 3 is a flowchart of a first example method of generating image-based feedback for milling, according to the disclosed technologies.
Figure 5:
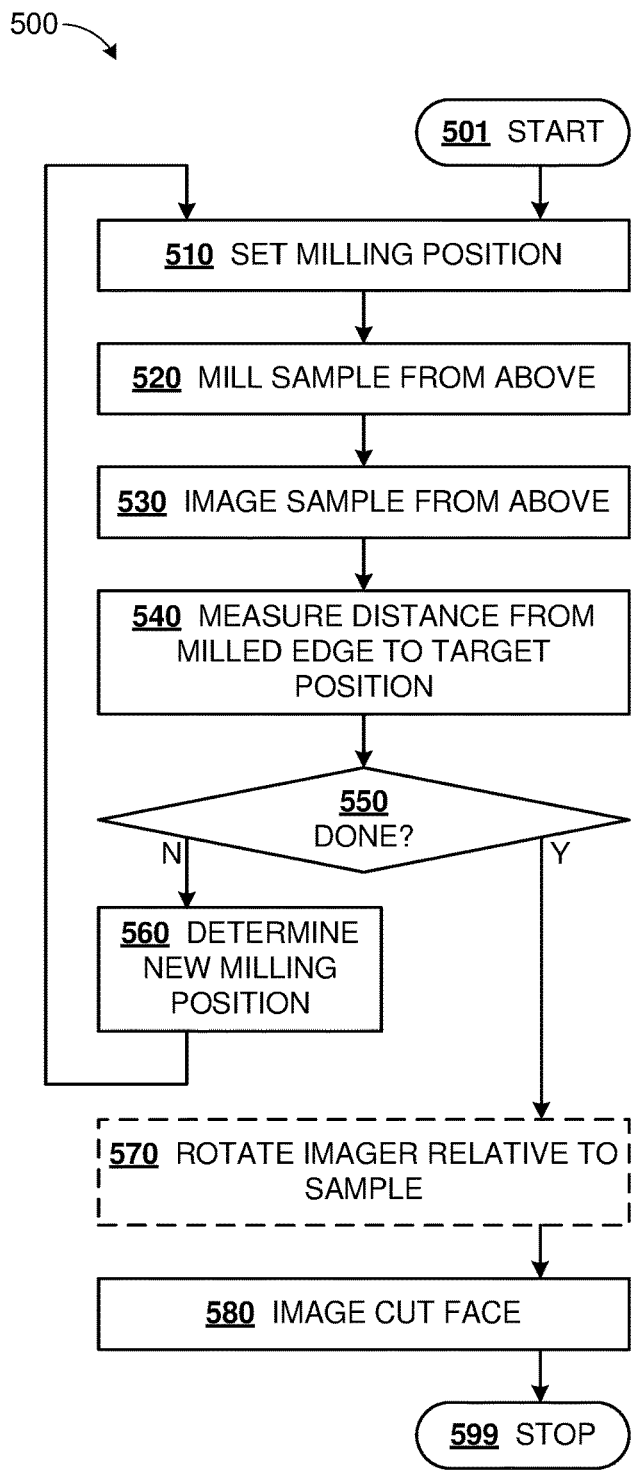
FIG. 5 is a flowchart of a third example method for milling with image-based feedback, according to the disclosed technologies.

Additional variations of FIG. 1 can omit certain features or can adopt features described in context of FIGS. 3-5 or elsewhere herein.

Example Geometries

Figures 2A, 2B:
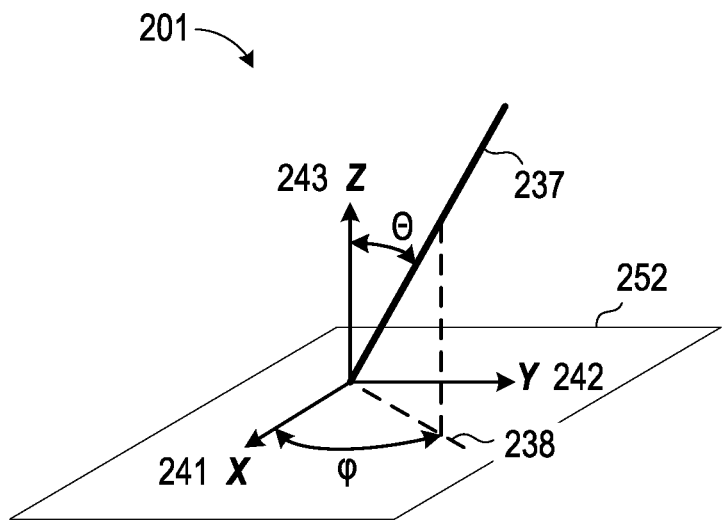
FIGS. 2A-2B are diagrams depicting example geometries in which the disclosed technologies can be deployed.

FIGS. 2A-2B are diagrams 201-202 depicting example geometries in which the disclosed technologies can be deployed. FIG. 2A is a diagram illustrating a coordinate system relative to a major (top) surface 252 of a sample, and generally similar to the coordinate system of FIG. 1. Orthogonal X and Y axes 241, 242 lie in the plane of surface 252, while Z axis 243 is an outward surface normal to surface 252. A particle beam axis 237 (which can be a view axis of an SEM or a beam axis of an FIB milling tool) approaches surface 252 from a polar angle $\theta$ with respect to Z axis 243; beam axis 237 has a projection 238 in the XY plane, which lies at an angle $\varphi$ counterclockwise from the X axis. Thus, $\varphi$ is an azimuthal coordinate of beam axis 237. As a matter of convention herein, beam axes are described extending outward from an origin on a sample surface (e.g. $0° \le \theta < 90°$, as shown in FIG. 2A), despite the direction of travel of beam particles being in an opposite direction and toward the sample surface.

Turning to FIG. 2B, diagram 202 is a table in which each row depicts an example equipment configuration with which the disclosed technologies can be used. Angle coordinates in table 202 are indicated with reference to FIG. 2A. In the first row 281, an imaging tool views sample surface 252 directly downward, similar to beam 135 of FIG. 1. The view axis orientation is along $\theta I=0°$ for which $\varphi I$ is indeterminate. A milling tool beam axis has an orientation $\theta M=45°-52°$, at any azimuthal angle $\varphi M$. In the second row 282, both imaging tool view axis and milling tool beam axis are at polar angles $\theta I$, $\theta M$ in a range $45°-52°$, however they have azimuthal orientations $90°$ apart. The third row 283 can be regarded as inverse to first row 281. The milling beam axis is aligned with the surface normal (Z axis 243) so that $\theta M=0°$, and $\theta M$ is indeterminate. The imaging view axis is at polar angle $\theta I=45°-52°$, and can be at any azimuthal angle $\varphi I$. The fourth row 284 has beams of both imaging tool and milling tool oriented directly downward onto surface 252. In some examples, the imaging tool and milling tool can be spatially offset from each other in the X or Y directions, and the sample can be translated on a stage between the imaging tool and the milling tool for respective operations. In other examples, beam optics can be used to combine beam paths from spatially separated beam sources onto a common axis at the sample surface.

In some examples, different configurations can be combined. For example, a vertical view axis can be used for imaging surface 252 to measure or control milling progress relative to a reference structure on surface 252. Subsequently, the imaging view axis can be tilted to perform imaging or other analysis on the cut face exposed by milling. That is, a configuration similar to row 281 can be used for measuring milling progress, and a configuration similar to row 282 can be used for metrology, imaging, or other analysis on the resulting cut face.

First Example Method

FIG. 3 is a flowchart 300 of a first example method for image-based feedback for milling a sample. In this method, a distance is determined, with which a subsequent milling operation can meet a target position criterion.

At block 310, an image of a surface of a sample is acquired from an SEM. Based on relative positions of a milled edge and a reference structure in the SEM image, a distance to shift a milled position can be determined at block 320. At block 330, the determined distance can be stored. The distance can be used to shift the milled edge, in a subsequent milling operation, to reach a predetermined spatial relationship with the reference structure.

To illustrate, the milled edge and the reference structure can be determined from the SEM image to have Y coordinates to −55 nm and +10 nm respectively, in which case the determined distance can be 65 nm. Other techniques can also be used to determine the distance, e.g. to correct for foreshortening or edge effect, or to skew the subsequent milling operation preferentially towards undershooting a target coordinate, as described further herein. A milled position can be shifted by further milling, which removes additional material. To illustrate, if the milled edge is parallel to the X axis at a Y coordinate of −55 nm, each successive sweep of a mill can remove up to 3 nm of material in the Y direction, progressively shifting the milled edge to Y=−52, −49, −46 nm, and so forth. In some examples, the relative Y coordinate of the milling beam axis relative to the stage can be varied to cause the milled position to shift as successive milling operations are performed.

Numerous variations and extensions can be implemented within the scope of disclosed technologies. In some examples, the subsequent milling operation can expose a cut face, and the method can extend to acquiring an image of the cut face from the SEM. That is, a single SEM can be used for metrology, imaging a top surface of the sample, and subsequently to image a cut face of the sample after the milling has reached the predetermined spatial relationship relative to the reference structure.

In further examples, the reference structure can define a datum. The predetermined spatial relationship can specify a tolerance range for a distance between the shifted edge (following the subsequent milling operation) relative to the datum. To illustrate, the datum can be a centroid of the reference structure located at Y=100 μm. The predetermined spatial relationship can specify that the shifted milled edge have a shifted Y coordinate between 90 and 95 μm; between 95 μm and 100 μm; or between 95 μm and 102 μm. In these illustrations, the datum can be outside the tolerance zone of the shifted milled edge, can be a limit value (endpoint) of the tolerance zone, or can be within the tolerance zone.

In some examples, the distance determination at block 320 can involve application of a linear scaling. For example, a non-zero polar angle of a view axis of the SEM can result in distances on an imaged top surface being foreshortened. To illustrate, if the SEM has a view axis along θ=45°, φ=90° (with reference to FIG. 2A), then distances along the Y axis can be foreshortened by a factor 1/sqrt (2)=0.7071. Accordingly, a Y separation determined from the SEM image at block 320 can be multiplied by a factor sqrt (2)=1.4142 to determine a true distance by which the milled edge should be shifted. In further examples, an offset can be included in the linear scaling (e.g. a linear scaling of the form y=A·x+B). In some scenarios, it can be desirable to undershoot a target position and undesirable to overshoot the target position. Simply put, an undershoot allows another opportunity to meet the specified tolerance, while an overshoot can result in the sample being discarded. Thus, incorporating a negative offset B can increase the likelihood that a third milling operation can fix an undershoot of the tolerance zone, if needed, and reduces the likelihood of discarding the sample due to overshoot. Such a negative offset can also be beneficial when there is no foreshortening (A=1). Particularly, process blocks 310, 320, 330 can be repeated after successive milling operations, including the subsequent milling operation, until the predetermined spatial relationship is achieved. Still further, the predetermined spatial relationship can be refined over successive iterations of blocks 310, 320, 330. To illustrate, on a first iteration, the spatial relationship can be a tolerance zone [0, +100 nm] relative to the target device, which can be tightened to [0, +10 nm] and [−3 nm, +3 nm] on second and third iterations. Iterations of blocks 310, 320, 330 can also terminate when a termination condition is met. To continue the previous illustration, the termination condition can be [−3 nm, +3 nm]. If the first iteration is determined to achieve a position of +2 nm (e.g. from an image acquired at block 310 of the second iteration), then no further milling or iterations are required.

The reference structure can incorporate two markings, for example two "+" markings on either side of a target device in the sample, and a centroid of the reference structure (e.g. a midpoint between the two "+" markings) can identify a position of a target device, in the sample, which is to be exposed by the subsequent milling operation. In some examples, the centroid can be at a position (e.g. a transverse position) of the target structure while, in other examples, the centroid can be a known offset distance away from the target structure or from a datum on the target structure. The known offset distance can be a predetermined distance, or can be determined at run time through analytic or metrology operations. The predetermined spatial relationship can be a tolerance zone about the centroid of the reference structure.

As described herein, SEM images can be subject to edge effect. An edge can appear as a bright line with finite width. The actual edge position can be offset from a centerline of the bright line. The offset can depend on geometric factors (e.g. polar angle of the imaging view axis, or dihedral angle between the cut face and the top surface of the sample) or on the sample material. Accordingly, determining the distance at block 320 can include making a correction for edge effect. In some applications, an amount of edge effect correction can be determined empirically, e.g. by tests performed on similar samples under similar conditions.

The method of FIG. 3 can be applied in a variety of applications including device manufacture or sample preparation. As an example from manufacturing, the instant method can be applied in the manufacture of a read-write transducer, where the predetermined spatial relationship can be a tolerance range relative to a reference structure indicating the location of the read-write transducer within the sample. As an example of sample preparation, the instant method can be applied in the preparation of a lamella for TEM analysis, where a reference structure can define a center plane of the lamella, and the instant method can be incorporated in a procedure to mill two cut faces of the lamella on opposite sides of the center plane. To illustrate, one cut face can be milled to a Y-coordinate range [+8 nm, +12 nm], while the other face can be milled (approaching from the opposite side) to a Y-coordinate range [−12 nm, −8 nm] to prepare a lamella having thickness 20±4 nm. The method can extend to performing the subsequent milling operation, e.g. using an FIB tool.

Additional variations of FIG. 3 can omit certain features or can adopt features described in context of FIG. 1 or FIGS. 4-5 or elsewhere herein.

Second Example Method

FIG. 4 is a flowchart 400 of a second example method for milling with image-based feedback. In this method, two milling operations are performed on a sample. An image of the sample is used to measure an edge after the first milling operation, and thereby determine a control setting for the second milling operation. The control setting is a value of a parameter used to control a position of a milling operation. The parameter can control steering of a beam used to perform the milling, a position of a stage upon which the sample is mounted, or a combination of beam and sample positioning.

At process block 410, a processor can cause a milling tool to mill the sample to a first edge, using a first value of the control parameter. Subsequently, at block 420, an image of a surface of the sample can be acquired from an SEM, the image depicting the first edge and a reference structure. At block 430, the processor can determine a second value of the control parameter, based on the first value and relative positions (in the image) of the first edge and the reference structure. To illustrate, if the image shows an offset of 25 nm in the Y direction between the first edge and the reference structure, the second value can be set to $C2=C1+\Delta$, where C1 is the first value of the control parameter and $\Delta$ is an adjustment to the control parameter corresponding to a shift of 25 nm in the Y direction. Then, at block 440, the processor can cause the milling tool to mill the sample to a second edge, using the second value of the control parameter.

Numerous variations and extensions can be implemented within the scope of disclosed technologies. The imaged surface for block 420 can be a major surface of the sample. The first edge can be a boundary between the imaged surface and a cut face exposed by milling at block 410. A dihedral angle between the imaged surface and the cut face can be in a range 60°-120° or 85°-95°. In some examples, the second value determination at block 430 can include applying a correction for an angle between a view axis of the SEM and a normal to the surface of the sample.

Compensating for Sidewall Slope

In some scenarios, the plane of the cut face may be tilted with respect to a beam axis of the milling tool, a phenomenon sometimes termed "sidewall slope". This can arise for a variety of reasons including beam spread, sample inhomogeneity, variation of etch rate with orientation of ion beam axis, anisotropic etching, or geometric misalignment. For FIB milling, a control program intended to produce a vertical cut face (e.g. dihedral angle of 90° between a remaining portion of the sample's top surface and the cut face) can commonly result in dihedral angle greater than 90°. But this is not always the case, and in other instances undercut can occur, with dihedral angle less than 90°.

Accordingly, in some examples, the processor can also cause a compensatory tilt to be applied between the milling tool and a stage on which the sample is mounted, prior to process block 410. The compensatory tilt can control the dihedral angle, between the second cut face and a remaining portion of the surface of the sample, to be within a predetermined range. To illustrate, the compensatory tilt can lead to the dihedral angle being in a range 90°±0.2°, 90°±0.5°, 90°±1°, or 90°±2°. That is, the compensatory tilt can enable a tolerance requirement to be met for orientation of the second cut face.

Figure 10:
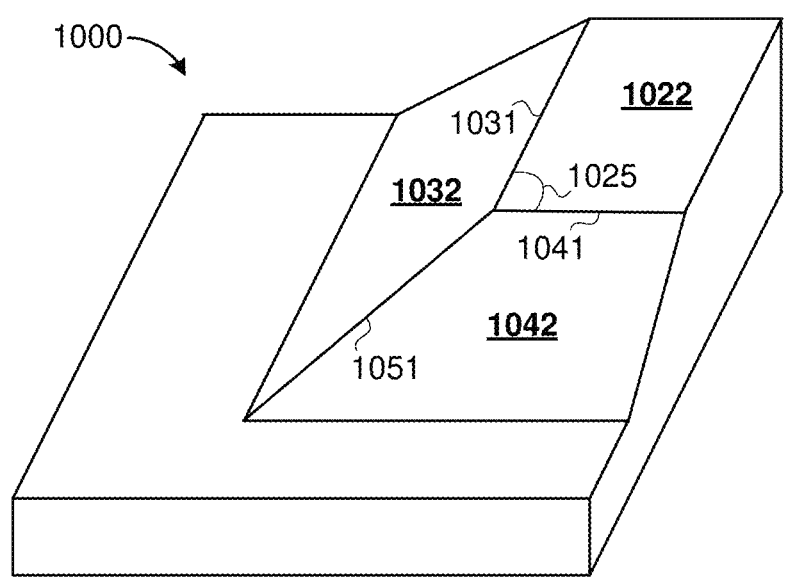
FIG. 10 is a diagram illustrating milling of a test sample according to this disclosure.

In further examples, the compensatory tilt can be determined by a procedure using a test sample 1000 shown in FIG. 10. The same or a different processor can cause the test sample 1000 to be milled to a third edge 1031 and to a fourth edge 1041, denoted as "third" and "fourth" to avoid confusion with the first and second edges described above. The third edge 1031 can be oriented on the test sample 1000 similarly to the orientation of the first edge on the (main) sample processed at blocks 410-440. Milling to the third edge 1031 can expose a third cut face 1032 on the test sample 1000. The third and fourth edges 1031, 1041 can intersect at an angle 1025 in a range 60°-120° on the major (top) surface 1022 of the sample 1000. Milling to the fourth edge 1041 can expose a fourth cut face 1042 on the test sample 1000, with third and fourth cut faces 1032, 1042 intersecting at a fifth edge 1051. Again, these cut faces 1032, 1042 are denoted "third" and "fourth" to match the labels of corresponding edges 1031, 1041 and avoid confusion with other cut faces described above. Thus, viewing the fourth cut face 1042 allows sidewall slope to be discerned. Accordingly, a second SEM image (of the fourth cut face 1042) can be acquired. The compensatory tilt angle can be determined from relative positions of the fourth and fifth edges 1041, 1051 in the second image. In varying examples, determination of the compensatory tilt can be made using the same or different milling and imaging tools as are used for blocks 410-440. In some examples, the test sample 1000 can be a distinct physical object from the main sample while, in other examples, the test sample operations and the main sample operations can be performed at distinct sites on a common wafer.

Although the description of FIG. 4 sometimes describes a single processor, the various operations of FIG. 4 and its several extensions or variations can be performed using multiple processors, in any combination. For example, distinct processors can perform control of the milling tool, control of the imaging tool, and/or metrology on an SEM image.

Additional variations of FIG. 4 can omit certain features or can adopt features described in context of FIG. 1, 3, or 5 or elsewhere herein.

Third Example Method and Example Stages of Sample Processing

FIG. 5 is a flowchart 500 of a third example method. In this method, milling operations on a sample are performed iteratively, guided by feedback from images of the sample showing the current milled state in relation to a target position. The third method is described with reference to FIGS. 6A-6D, which are diagrams 601-604 showing views of a sample undergoing a sequence of operations.

Figure 6A:
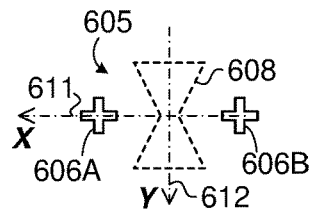
FIGS. 6A-6D are diagrams depicting views of a sample undergoing a sequence of operations according to an example of the disclosed technologies.

FIG. 6A shows an initial top view 601 of sample 605. Markings 606A, 606B (collectively, reference structure 606) are visible in top view 601. Bow-tie shaped device 608 is fabricated within the sample and is shown in dashed outline because, in the illustrated example, device 608 is buried within the sample and may not be visible in the top view. An objective in this illustrative example can be to produce a mill edge within a tolerance range (along Y axis 612) relative to the waist of device 608. The waist is level with a centerline (coincident with X axis 611) joining markings 606A, 606B. Each marking is shown having a shape of a cross, as is common in the art, but other shapes can be used.

The method starts at block 501 and stops at block 599. From block 501, an iterative loop can be entered at process block 510. At block 510, a milling position can be set. To illustrate, the milling position can be a Y coordinate with respect to axes 611, 612 of FIG. 6A, which can be similar to axes 141, 142 of FIG. 1.

Figure 6B:
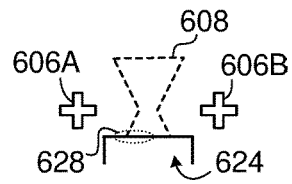

At block 520, the sample can be milled from above, which can be understood as a milling beam axis having polar angle (similar to 123 of FIG. 1) less than or equal to 60°. In FIG. 6B, a milled trench 624 appears in top view (similar to slot 154), with edge 628 corresponding to a "first edge" described in certain examples herein, or edge 148A of FIG. 1. Other features of FIG. 6B correspond to features described in context of FIG. 6A. In varying examples, milling can be performed using an FIB tool, or another type of milling tool.

At block 530, the sample can be imaged from above, for example along a view axis having polar angle (similar to 133 of FIG. 1) less than or equal to 60°. The image can depict features similar to those illustrated in FIG. 6B. However, in some examples, dashed outline device 608 may not be visible because it is buried below the imaged surface. In other examples, an outline of buried device 608 may be visible because of corresponding variations in surface height. In further examples, device 608 may be visible because the top surface has been previously etched to expose device 608.

Figure 6C:
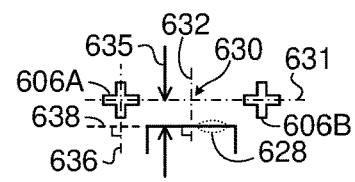

At block 540, and with reference to FIG. 6C, a distance 635 can be measured from edge 628 to a target position, which can be the Y coordinate of centerline 631 of reference structure 606. In some examples distance 635 can be measured along perpendicular 632 from the midpoint 630 of centerline 631 to edge 628. In other examples, distance 635 can be measured along perpendicular 636 from centroid of marking 606A to extension 638 of edge 628. Alternatively, other measurement techniques can be used. One or more corrections can be applied for image foreshortening or edge effect, as described herein.

At decision block 550, a check can be made whether the iterative milling procedure is complete. In some examples, a termination criterion can be whether distance 635 is within a tolerance range while, in other examples, a termination criterion can be whether a predetermined iteration count has been reached. Compound termination criteria can be used. To illustrate, the iteration loop can be terminated if distance 631 is within [−2 nm, +5 nm], or after 3 iterations, whichever comes first.

Upon determination that the loop iterations are not complete, the method can follow the N branch from decision block 550 to process block 560, where a new milling position can be determined. For example, the new milling position can be based on the immediately preceding milling position (e.g. at block 510) and on the measured distance 635. In varying examples, a linear scaling or a correction for edge effect can be applied, as described herein. The method can return to block 510 to set the new milling position, e.g. by setting a control parameter of a milling tool or of a translation stage supporting the sample.

Decision block 550 can also result in a determination that the loop iterations are complete. In some instances, iterations can be complete after a single pass through blocks 510-540 while, in other instances, 2, 3, 4, or even more iterations can be performed before completion of loop iterations. Eventually, upon meeting a termination criterion, the method can follow the Y branch from block 550 to either block 570 or block 580.

Figure 6D:
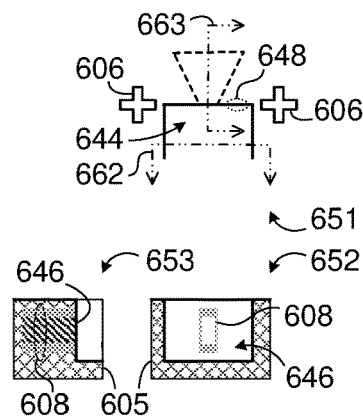

FIG. 6D shows top view 651, front cross-section view 652 (through section line 662), and side cross-section view 653 (through section line 663) of sample 605 upon exit from the iteration loop via the Y branch from block 550. As illustrated, trench 644 has been enlarged relative to trench 624 of FIG. 6B, and edge 648 has been aligned with a centerline (not shown in FIG. 6D, see 631 of FIG. 6C) of reference structure 606. Front section view 652 shows cut face 646 (similar to 156) with device 608 exposed (similar to 158). These features are also visible in side section view 653.

In some examples, the imager used at block 530 can be rotated at optional process block 570 (shown in dashed outline). To illustrate, a view axis for block 530 can have a polar angle near 0° (e.g. less than 5° or less than) 10°, similar to view axis 135, and the view axis can be rotated to a polar angle in a range 45°-52°, similar to view axis 137, at block 570. In other examples, a view axis similar to 137 can be used at block 530, and an azimuthal rotation can be performed at block 570 to bring a view axis of the imaging tool closer to a normal (e.g. axis 142) to cut face (e.g. 156). As described herein, rotation of the view axis can be performed relative to the sample, either by rotating an imaging tool 130 or by rotating a stage 150 upon which the sample is mounted, or by a combination of multiple rotations. Optionally, a relative translation can also be performed at block 570. However, in other examples, a view axis with polar angle (e.g. 133) in a range 40°-60° can provide sufficient imaging accuracy and resolution for both top surface imaging at block 530 and later imaging of the cut face. In such examples, block 570 can be omitted.

With a suitable imaging view axis (with or without block 570) obtained, the cut face of the sample can be imaged at process block 580. Particularly, a same imaging tool can be used at blocks 530, 580. However, this is not a requirement and, in some examples, different imaging tools can be used for blocks 530, 580. In particular examples, imaging at block 580 can be performed by the FIB tool used for milling at process block 520. Other analytic or process operations can be performed on the cut face at block 580, additionally or alternatively to imaging.

Numerous variations and extensions of the third method can be implemented within scope of disclosed technologies. In some examples, blocks 510-540 can be performed twice (or fewer or more times) to converge on a fixed target value. Such iterations can be performed for manufacture or analysis of device 608.

In other examples, blocks 510-540 can be performed iteratively to step through a sequence of target positions. For example, analysis can be performed on device 608 on a succession of cut faces along the Y direction of device 608. As an illustration, it can be desired to analyze sections of device 608 at 20 nm intervals Y={−60 nm, −40 nm, −20 nm, 0 nm, . . . , +60 nm}. A preliminary milling operation can reach Y=−75 nm (e.g. first pass, blocks 510, 520). The distance to the first target position can be measured as −60 nm−(−75 nm)=+15 nm (first pass, blocks 530, 540) and the loop can iterate through blocks 560, 510, 520 to reach Y=−62 nm which, in this illustration, is within a tolerance range of the first target position Y=−60 nm. Then, on the second pass, the distance to the next target position (−40 nm) can be measured between blocks 530 and 560, which is +22 nm. Additionally, an imaging or other operation similar to block 580 can be performed before continuing with further milling at third pass, block 520. Illustratively, the third pass can overshoot to Y=−39 nm, while remaining within tolerance zone of the second target (−40 nm). Thus, on the third pass, a distance of +19 nm to the third target (−20 nm) can be determined (third pass, blocks 530, 540), and an imaging or other operation can be performed for the second target position (−40 nm) before the next milling operation (fourth pass, block 520) attempts to reach the third target position (−20 nm). Thus, successive iterations can step through the desired sequence of sections at Y={−60 nm, . . . +60 nm} (to within a predetermined tolerance), acquiring images or performing other analysis at each section. In varying examples: a fixed view axis orientation can be used for both block 520 and imaging successive cut faces; imaging or analysis performed at each section can use different tool(s) than the imager used for block 520; or the imaging tool can be rotated back and forth between optimal view axes for top surface imaging and cut face imaging.

In further examples, additional iterations of blocks 510-540 can be performed for convergence at positions of one or more of the desired sections.

Additional variations of FIGS. 5-6 can omit certain features or can adopt features described in context of FIG. 1 or FIGS. 3-4 or elsewhere herein.

Example Applications

Figure 7:
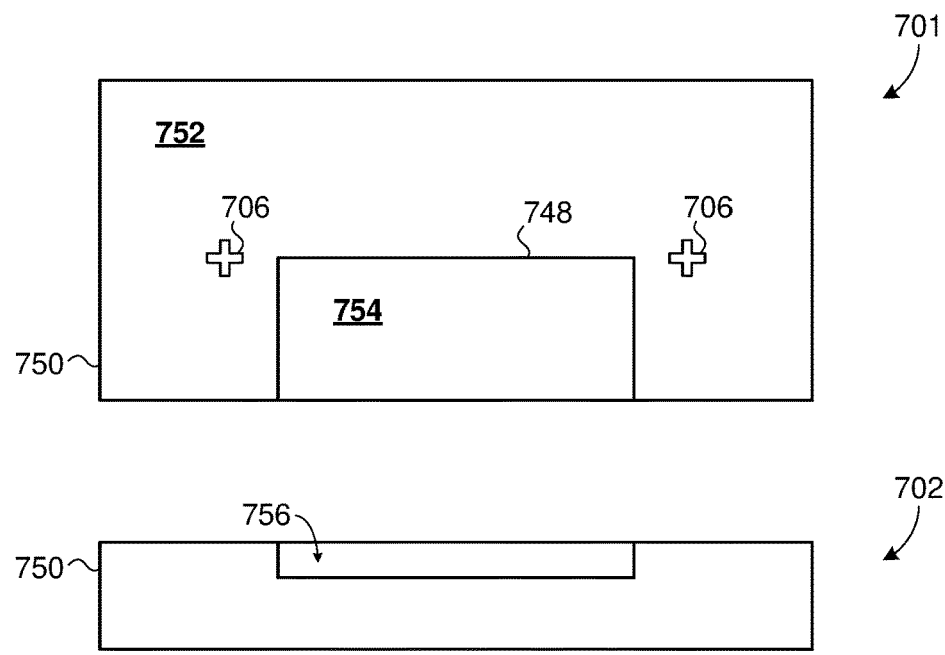
FIG. 7 shows views of a first example application of the disclosed technologies.

FIG. 7 shows top view 701 and elevation 702 of a first application of the disclosed technologies. In this application, milling is performed from one side to obtain an edge at, or within a tolerance zone from, a target position. Sample 750 has a top surface 752 on which two markings of reference structure 706 are visible. A slot 754 has been milled to edge 748, exposing cut face 756. With the disclosed technologies, edge 748 can be accurately placed relative to reference structure 706.

The application of FIG. 7 can be suitable for both manufacturing and analytic workflows. In some examples, a manufactured device can be milled to within a predetermined tolerance of a target position. That is, milling according to the disclosed technologies can produce an accurately manufactured device for use in a product. Such products can include read-write transducers for a magnetic storage appliance, a semiconductor laser, or a micro electromechanical structure (MEMS) such as a tuned oscillator. In other examples, milling can be destructively applied to expose an interior of a device for imaging, metrology, or other analytic procedures. For example, a doping profile can be measured across an accurately positioned slice (the cut face) of a device. Analysis can be performed on active or passive electronic devices, including read-write transducers, laser modules, semiconductor chips, MEMS devices, sensors, or nanostructures.

Figure 8:
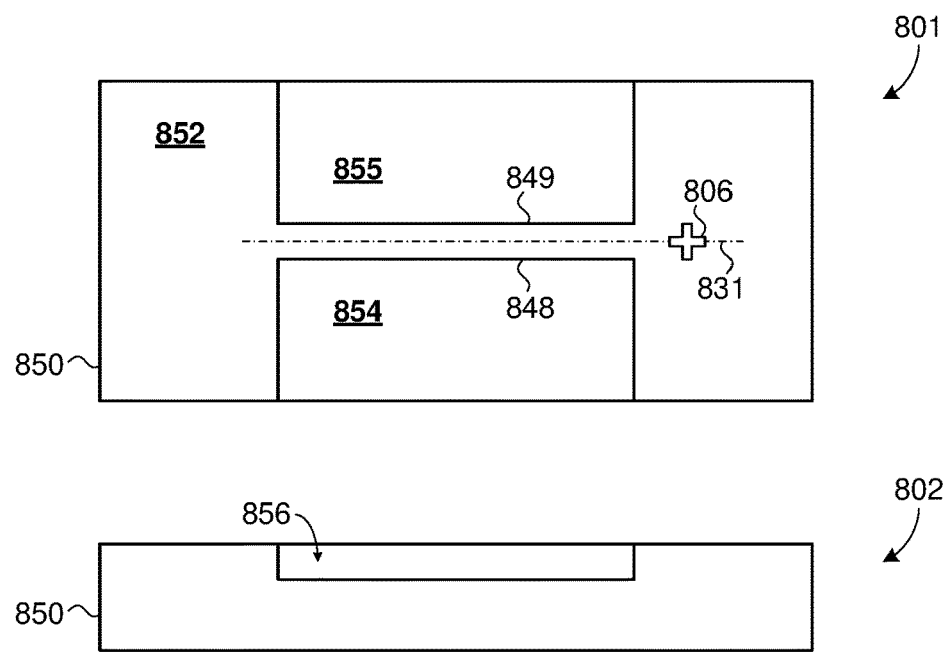
FIG. 8 shows views of a second example application of the disclosed technologies.

FIG. 8 shows top view 801 and elevation 802 of a second application of the disclosed technologies. In this application, milling is performed from two sides to place edges within respective tolerance zones relative to a reference structure. Sample 850 has a top surface 852 on which reference structure 806 is visible. Slots 854, 855 have been milled to edges 848, 849, exposing two cut faces, one of which 856 is visible in elevation 802. With the disclosed technologies, edges 848, 849 can be accurately placed relative to reference structure 806, and a lamella of a desired thickness can be accurately produced.

The application of FIG. 8 can be suitable for both manufacturing and analytic workflows. In some examples, a manufactured device can be accurately milled to a predetermined thickness at a particular position within sample 850. Such products can include lamella or other membranes for MEMS resonators, thin film sensors, or sampling probes. In other examples, milling can be destructively applied to expose develop a lamella for TEM or other analytic procedures. Samples suitable for lamella preparation using the disclosed technologies can arise in many fields using MEMS, photolithographic, or epitaxial manufacturing techniques. Samples can include semiconductor, optical, optoelectronic, MEMS, or advanced materials.

A Generalized Computer Environment

Figure 9:
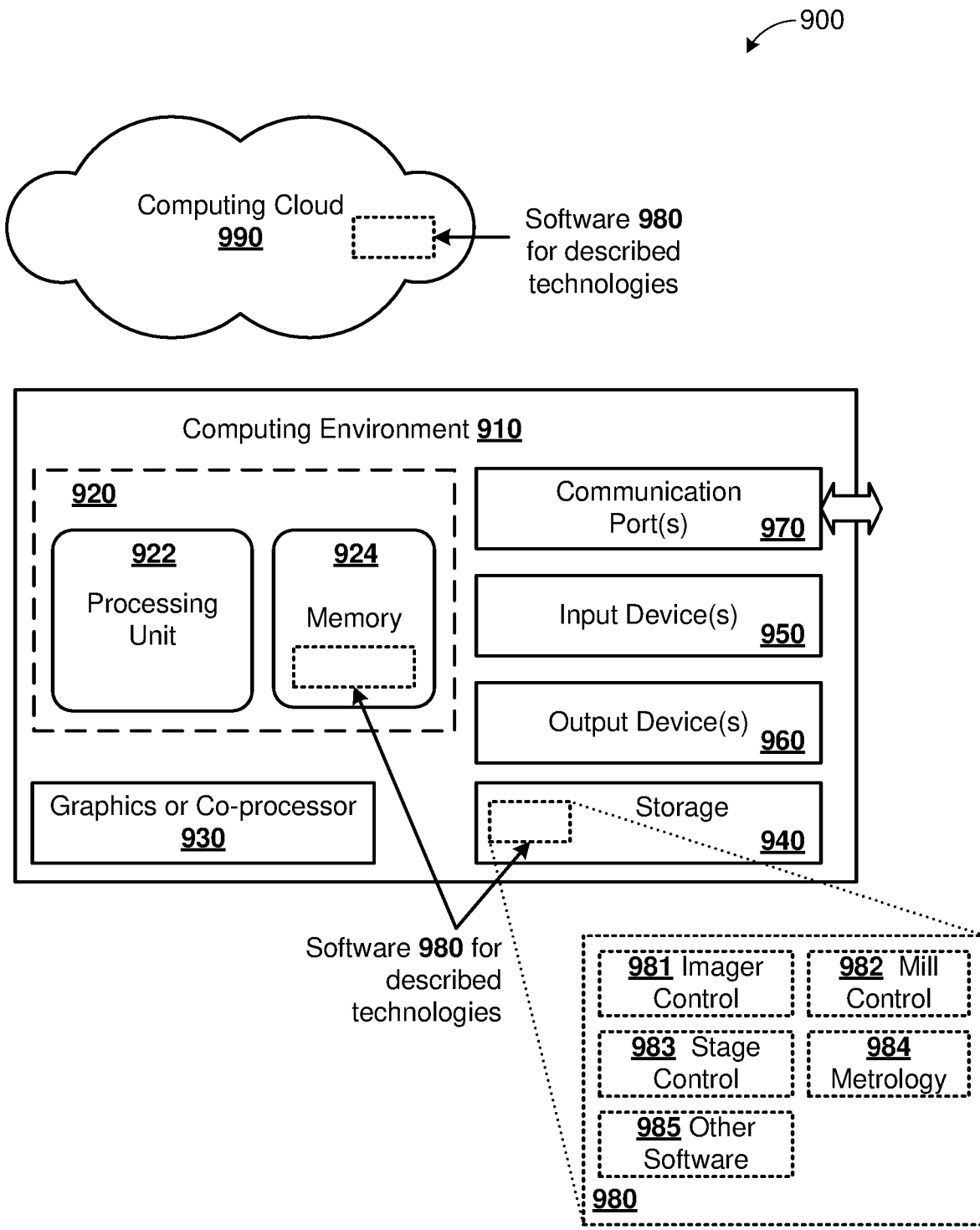
FIG. 9 illustrates a generalized example of a suitable computing environment in which described embodiments, techniques, and technologies pertaining to imaging or milling can be implemented.

FIG. 9 illustrates a generalized example of a suitable computing system 900 in which described examples, techniques, and technologies can be implemented for integrating microscopy feedback into a milling procedure, e.g. by determining an amount to shift a milling position. The computing system 900 is not intended to suggest any limitation as to scope of use or functionality of the present disclosure, as the innovations can be implemented in diverse general-purpose or special-purpose computing systems. The computing system 900 can control an SEM imaging tool, an FIB milling tool, a stage, an analytic instrument, or other similar equipment; can perform metrology or other analysis on images or other acquired data representative of a sample; can control a stage, ion beam column, or electron beam column to apply tilts or azimuthal rotations between a stage mounted sample and the electron or ion beam; or can acquire, process, output, or store measurement data.

With reference to FIG. 9, the computing environment 910 includes one or more processing units 922 and memory 924. In FIG. 9, this basic configuration 920 is included within a dashed line. Processing unit 922 can execute computer-executable instructions, such as for control, metrology, or other functions as described herein. Processing unit 922 can be a general-purpose central processing unit (CPU), a processor in an application-specific integrated circuit (ASIC), or any other type of processor. In a multi-processing system, multiple processing units execute computer-executable instructions to increase processing power. Computing environment 910 can also include a graphics processing unit or co-processing unit 930. Tangible memory 924 can be volatile memory (e.g., registers, cache, or RAM), non-volatile memory (e.g., ROM, EEPROM, or flash memory), or some combination thereof, accessible by processing units 922, 930. The memory 924 stores software 980 implementing one or more innovations described herein, in the form of computer-executable instructions suitable for execution by the processing unit(s) 922, 930. For example, software 980 can include software 981 for controlling an SEM or other imaging tool, software 982 for controlling an FIB tool or other milling tool, software 983 for controlling a stage on which a sample is supported, software 984 for performing metrology or other analysis on sample data, or other software 985 (including user interface, host interface, or fault detection). The inset shown for software 980 in storage 940 can be similarly applicable to software 980 elsewhere in FIG. 9. The memory 924 can also store control parameters, calibration data, measurement data, other database data, configuration data, or operational data.

A computing system 910 can have additional features, such as one or more of storage 940, input devices 950, output devices 960, or communication ports 970. An interconnection mechanism (not shown) such as a bus, controller, or network interconnects the components of the computing environment 910. Typically, operating system software (not shown) provides an operating environment for other software 980 executing in the computing environment 910, and coordinates activities of the components of the computing environment 910.

The tangible storage 940 can be removable or non-removable, and includes magnetic disks, magnetic tapes or cassettes, CD-ROMs, DVDs, or any other medium which can be used to store information in a non-transitory way and which can be accessed within the computing environment 910. The storage 940 stores instructions of the software 980 (including instructions and/or data) implementing one or more innovations described herein. Storage 940 can also store image data, measurement data, workflow programs, reference data, calibration data, configuration data, sample data, or other databases or data structures described herein.

The input device(s) 950 can be a mechanical, touch-sensing, or proximity-sensing input device such as a keyboard, mouse, pen, touchscreen, or trackball, a voice input device, a scanning device, or another device that provides input to the computing environment 910. The output device(s) 960 can be a display, printer, speaker, optical disk writer, or another device that provides output from the computing environment 910. Input or output can also be communicated to/from a remote device over a network connection, via communication port(s) 970.

The communication port(s) 970 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 910, either as an input device 950 or coupled to a communication port 970, and can include analog-to-digital converters or connections to an instrumentation bus. An instrumentation control system can be integrated into computing environment 910, either as an output device 960 or coupled to a communication port 970, and can include digital-to-analog converters, switches, or connections to an instrumentation bus.

In some examples, computer system 900 can also include a computing cloud 990 in which instructions implementing all or a portion of the disclosed technology are executed. Any combination of memory 924, storage 940, and computing cloud 990 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "acquire," "apply," "correct," "determine," or "produce" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "maximum," "optimum," "extremum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 9, computer-readable storage media include memory 924, and storage 940. The terms computer-readable media or computer-readable storage media do not include signals and carrier waves. In addition, the terms computer-readable media or computer-readable storage media do not include communication ports (e.g., 970).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, *Julia*, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples and should not be taken as limiting the scope of the claims. Rather, the scope of the claimed subject matter is defined by the following claims. We therefore claim all that comes within the scope and spirit of these claims.

Additional Examples

The following numbered paragraphs describe additional examples of the disclosed technologies. Advantages ascribed to any paragraph are similarly applicable to any paragraph dependent therefrom.

A1. An apparatus comprising: a milling tool configured to mill a sample using a first particle beam; an imaging tool configured to generate one or more images of the sample using a second particle beam; and a controller configured to: cause the milling tool to mill the sample to a first edge, using a first value of a control parameter; determine a second value of the control parameter changed from the first value by an amount based on a distance between the first edge and a target position, wherein the distance is determined from an image, acquired by the imaging tool, of a surface of the sample; and cause the milling tool to mill the sample to a second edge, using the second value of the control parameter. This apparatus can advantageously place the second edge more accurately than without feedback from the imaging tool.

A2. The apparatus of paragraph A1, wherein the first particle beam and the second particle beam comprise different respective species. This apparatus can advantageously use superior imaging resolution of the particle species of the second particle beam to improve accuracy of milling with the first particle beam.

A3. The apparatus of any one of paragraphs A1-A2, wherein the first particle beam is a focused ion beam (FIB) and the imaging tool comprises a scanning electron microscope (SEM). This apparatus can advantageously use superior imaging resolution of the SEM to improve accuracy of milling with the FIB.

A4. The apparatus of any one of paragraphs A1-A3, wherein the image is a first image, the milling to the second edge exposes a cut face of the sample, and the controller is further configured to: cause the imaging tool to acquire a second image of the cut face of the sample. This apparatus can advantageously acquire the second image at a cut face more accurately placed than without feedback from the imaging tool.

A5. The apparatus of paragraph A4, wherein an orientation of a view axis of the imaging tool is common to the first image and the second image. This apparatus can advantageously provide feedback to the milling procedure and acquire the second image without an extra operation of changing the view axis.

A6. The apparatus of paragraph A4, wherein the controller is configured to cause a view axis of the imaging tool to be rotated relative to the sample, between the acquiring the first image and the acquiring the second image. This apparatus can advantageously acquire first and second images with optimized view axes for each image.

A7. The apparatus of paragraph A6, wherein the view axis of the imaging tool is within 10° of a normal to the surface for acquiring the first image, and in a range 40°-60° from the normal to the surface for acquiring the second image. This apparatus configuration advantageously reduces solid angle required for each tool, so that more tools can have access to the sample or sample chamber through respective ports.

A8. The apparatus of any one of paragraphs A1-A7, wherein the control parameter determines a position, in a direction along the surface and perpendicular to the first edge, of a sweep of the milling tool. This apparatus configuration advantageously improves accuracy of mill edge coordinate in the perpendicular direction.

B1. A method comprising: acquiring, from a scanning electron microscope (SEM), an image of a surface of a sample; and determining a distance to shift a milling position based on relative positions of a milled edge and a reference structure in the image; and storing the distance; wherein the stored distance is usable for shifting the milled edge, in a subsequent milling operation, to a predetermined spatial relationship with the reference structure. This method can advantageously enable the second edge to be placed more accurately than without feedback from the SEM image.

B2. The method of paragraph B1, wherein the image is a first image and the method further comprises: acquiring, from the SEM, a second image of a cut face exposed by the subsequent milling operation. This method can advantageously acquire the second image at a cut face more accurately placed than without feedback using the first SEM image.

B3. The method of any one of paragraphs B1-B2 wherein the distance is a first distance and, for a second distance from (i) a datum defined by the reference structure to (ii) a line containing the shifted milled edge, the predetermined spatial relationship is a tolerance range of the second distance. This method can advantageously meet a tighter tolerance range or can increase the likelihood of meeting the tolerance range than without feedback from the SEM image.

B4. The method of any one of paragraphs B1-B3, wherein the distance is a first distance, and the determining the first distance further comprises: determining a second distance from a central coordinate of the reference structure to a line containing the milled edge; and applying a linear scaling to the second distance to obtain the first distance. This method can advantageously correct for image foreshortening or edge effect, can increase the likelihood of undershoot, or can decrease the likelihood of overshoot.

B5. The method of any one of paragraphs B1-B4, wherein the reference structure comprises two distinct markings, and a centroid of the reference structure identifies a position of a target device, in the sample, to be exposed by the subsequent milling operation. This method can advantageously improve accuracy of identifying a target device as compared to using a single reference marking.

B6. The method of paragraph B5, wherein the predetermined spatial relationship is a tolerance zone about the centroid of the reference structure. This method can advantageously attain a smaller tolerance zone or can increase the likelihood of attaining the tolerance zone than without feedback from the SEM image.

B7. The method of any one of paragraphs B1-B6, further comprising: repeating the acquiring and determining operations after respective milling operations, including the subsequent milling operation, until a termination condition is met. This method can advantageously provide iterative convergence to a fixed target position or can advantageously step through a sequence of target positions.

B8. The method of paragraph B7, wherein the repeated operations provide convergence to a given target position on the sample. This method can advantageously reduce the likelihood of overshoot in accurately reaching the target position.

B9. The method of paragraph B7, wherein the repeated operations successively target a sequence of target positions on the sample. This method can advantageously improve accuracy of exposing a succession of cut faces, e.g. for analysis, in the sample.

B10. The method of any one of paragraphs B1-B9, wherein the method further comprises: correcting the distance for edge effect at the first edge. This method can advantageously provide improved accuracy of the distance determination.

B11. The method of any one of paragraphs B1-B10, wherein the sample comprises a read-write transducer. This method can advantageously provide improved dimensional control of manufactured read-write transducers.

B12. The method of any one of paragraphs B1-B11, wherein the sample comprises a lamella for transmission electron microscopy. This method can advantageously provide improved thickness control of a TEM lamella.

B13. The method of any one of paragraphs B1-B12, further comprising: performing the subsequent milling operation using a focused ion beam (FIB). This method can advantageously provide improved accuracy for the subsequent FIB milling operation.

C1. One or more computer-readable storage media having defined therein executable instructions which, when executed by one or more processors, actuate the one or more processors to: cause a milling tool to mill a sample to a first edge, using a first value of a control parameter; acquire, from a scanning electron microscope (SEM), an image depicting the first edge and a reference structure on a surface of the sample; based on the first value and on relative positions, in the image, of the first edge and the reference structure, determine a second value of the control parameter; and cause the milling tool to mill the sample to a second edge, using the second value of the control parameter. This technology can advantageously place the second edge more accurately than without using the image acquired from the SEM.

C2. The one or more computer-readable storage media of paragraph C1, wherein the determining the second value of the control parameter comprises applying a correction for an angle between a view axis of the SEM and a normal to the surface of the sample. This method can advantageously correct for image foreshortening.

C3. The one or more computer-readable storage media of any one of paragraphs C1-C2, wherein the surface is a major surface of the sample, the first edge is a boundary between the major surface and a cut face exposed by the milling to the first edge, and a dihedral angle between the cut face and the major surface is in a range 60°-120°. This technology can advantageously improve placement of a cut face orthogonal to a top surface of the sample, or within 30° of such orthogonal.

C4. The one or more computer-readable storage media of any one of paragraphs C1-C3, wherein the milling the sample to the first and second edges exposes first and second cut faces of the sample respectively, and the instructions further actuate the processors to: cause a compensatory tilt, between the milling tool and a stage on which the sample is mounted, to be applied before the milling to the first edge; wherein the compensatory tilt controls a dihedral angle, between (i) the second cut face and (ii) a remaining portion of the surface of the sample, to be within a predetermined range. This technology can advantageously compensate for sidewall slope to improve accuracy of cut face orientation.

C5. The one or more computer-readable storage media of paragraph C4, wherein the sample is a first sample, the image is a first image, the SEM is a first SEM, and the instructions further actuate the processors to: cause the milling tool to mill a second sample to a third edge, exposing a third cut face of the second sample; cause the milling tool to mill the second sample to a fourth edge, thereby exposing a fourth cut face of the second sample, wherein the third and fourth edges make an angle between 60°-120° inclusive on a major surface of the second sample, and wherein the third and fourth cut faces intersect in a fifth edge; acquire, from a second SEM, a second image of the fourth cut face; and determine the compensatory tilt angle from relative positions of the fourth and fifth edges in the second image. This technology can advantageously use a second sample to improve accuracy of cut face orientation.

We claim:
1. An apparatus comprising:
a milling tool configured to mill a sample using a first particle beam;
an imaging tool configured to generate one or more images of the sample using a second particle beam; and
a controller configured to:
cause the milling tool to mill the sample to a first edge, using a first value of a control parameter;
determine a second value of the control parameter changed from the first value by an amount based on a distance between the first edge and a target position, wherein the distance is determined from an image, acquired by the imaging tool, of a surface of the sample, and wherein the image indicates, on the surface, the first edge and the target position; and
cause the milling tool to mill the sample to a second edge, using the second value of the control parameter.

2. The apparatus of claim 1, wherein the first particle beam and the second particle beam comprise different respective species.

3. The apparatus of claim 1, wherein the first particle beam is a focused ion beam (FIB) and the imaging tool comprises a scanning electron microscope (SEM).

4. The apparatus of claim 1, wherein the image is a first image, the milling to the second edge exposes a cut face of the sample, and the controller is further configured to:
cause the imaging tool to acquire a second image of the cut face of the sample.

5. The apparatus of claim 4, wherein an orientation of a view axis of the imaging tool is common to the first image and the second image.

6. The apparatus of claim 4, wherein the controller is configured to cause a view axis of the imaging tool to be rotated relative to the sample, between the acquiring the first image and the acquiring the second image.

7. The apparatus of claim 6, wherein the view axis of the imaging tool is within 10° of a normal to the surface for acquiring the first image, and in a range 40°-60° from the normal to the surface for acquiring the second image.

8. The apparatus of claim 1, wherein the control parameter determines a position, in a direction along the surface and perpendicular to the first edge, of a sweep of the milling tool.

9. A method comprising:
acquiring, from a scanning electron microscope (SEM), an image of a surface of a sample; and determining a distance to shift a milling position based on relative positions of a milled edge and a reference structure in the image; and storing the distance;

wherein the stored distance is usable for shifting the milled edge, in a subsequent milling operation, to a predetermined spatial relationship with the reference structure.

10. The method of claim 9, wherein the image is a first image and the method further comprises:

acquiring, from the SEM, a second image of a cut face exposed by the subsequent milling operation.

11. The method of claim 9 wherein the distance is a first distance and, for a second distance from (i) a datum defined by the reference structure to (ii) a line containing the shifted milled edge, the predetermined spatial relationship is a tolerance range of the second distance.

12. The method of claim 9, wherein the distance is a first distance, and the determining the first distance further comprises:

determining a second distance from a central coordinate of the reference structure to a line containing the milled edge; and applying a linear scaling to the second distance to obtain the first distance.

13. The method of claim 9, wherein the reference structure comprises two distinct markings, and a centroid of the reference structure identifies a position of a target device, in the sample, to be exposed by the subsequent milling operation.

14. The method of claim 13, wherein the predetermined spatial relationship is a tolerance zone about the centroid of the reference structure.

15. The method of claim 9, further comprising:

repeating the acquiring and determining operations after respective milling operations, including the subsequent milling operation, until a termination condition is met.

16. The method of claim 15, wherein the repeated operations provide convergence to a given target position on the sample.

17. The method of claim 15, wherein the repeated operations successively target a sequence of target positions on the sample.

18. The method of claim 9, wherein the method further comprises:

correcting the distance for edge effect at the first edge.

19. The method of claim 9, wherein the sample comprises a read-write transducer.

20. The method of claim 9, wherein the sample comprises a lamella for transmission electron microscopy.

21. The method of claim 9, further comprising:

performing the subsequent milling operation using a focused ion beam (FIB).

22. One or more computer-readable storage media having defined therein executable instructions which, when executed by one or more processors, actuate the one or more processors to:

cause a milling tool to mill a sample to a first edge, using a first value of a control parameter;

acquire, from a scanning electron microscope (SEM), an image depicting the first edge and a reference structure on a surface of the sample;

based on the first value and on relative positions, in the image, of the first edge and the reference structure, determine a second value of the control parameter; and cause the milling tool to mill the sample to a second edge, using the second value of the control parameter.

23. The one or more computer-readable storage media of claim 22, wherein the determining the second value of the control parameter comprises applying a correction for an angle between a view axis of the SEM and a normal to the surface of the sample.

24. The one or more computer-readable storage media of claim 22, wherein the surface is a major surface of the sample, the first edge is a boundary between the major surface and a cut face exposed by the milling to the first edge, and a dihedral angle between the cut face and the major surface is in a range 60°-120°.

25. The one or more computer-readable storage media of claim 22, wherein the milling the sample to the first and second edges exposes first and second cut faces of the sample respectively, and the instructions further actuate the processors to:

cause a compensatory tilt, between the milling tool and a stage on which the sample is mounted, to be applied before the milling to the first edge;

wherein the compensatory tilt controls a dihedral angle, between (i) the second cut face and (ii) a remaining portion of the surface of the sample, to be within a predetermined range.

26. The one or more computer-readable storage media of claim 25, wherein the sample is a first sample, the first and second edges are on the first sample, the image is a first image, the SEM is a first SEM, and the instructions further actuate the processors to:

cause the milling tool to mill a second sample to a first edge of the second sample, exposing a first cut face of the second sample;

cause the milling tool to mill the second sample to a second edge of the second sample, thereby exposing a second cut face of the second sample, wherein the first and second edges of the second sample make an angle between 60°-120° inclusive on a major surface of the second sample, and wherein the first and second cut faces of the second sample intersect in a third edge of the second sample;

acquire, from a second SEM, an image of the second cut face of the second sample; and determine the compensatory tilt angle from relative positions of the second and third edges of the second sample in the image of the second cut face of the second sample.

* * * * *

UNITED STATES PATENT AND TRADEMARK OFFICE
CERTIFICATE OF CORRECTION

PATENT NO. : 12,249,482 B2
APPLICATION NO. : 17/873532
DATED : March 11, 2025
INVENTOR(S) : Thomas Gary Miller et al.

It is certified that error appears in the above-identified patent and that said Letters Patent is hereby corrected as shown below:

In the Claims

In Column 26, Line 56, Claim 6, delete "between the" and insert -- between --, therefor.

In Column 26, Line 57, Claim 6, delete "and the" and insert -- and --, therefor.

In Column 27, Line 13, Claim 11, delete "9" and insert -- 9, --, therefor.

In Column 27, Line 19, Claim 12, delete "and the" and insert -- and --, therefor.

In Column 28, Line 12, Claim 23, delete "wherein the" and insert -- wherein --, therefor.

In Column 28, Line 23, Claim 25, delete "wherein the" and insert -- wherein --, therefor.

Signed and Sealed this
Fifteenth Day of April, 2025

Coke Morgan Stewart
*Acting Director of the United States Patent and Trademark Office*